(12) United States Patent
Kobayashi

(10) Patent No.: US 7,874,642 B2
(45) Date of Patent: Jan. 25, 2011

(54) RECORDING APPARATUS HAVING FLEXIBLE WIRING MEMBER PORTIONS OF WHICH OVERLAP EACH OTHER

(75) Inventor: Isao Kobayashi, Nagoya (JP)

(73) Assignee: Brother Kogyo Kabushiki Kaisha, Aichi-Ken (JP)

( * ) Notice: Subject to any disclaimer, the term of this patent is extended or adjusted under 35 U.S.C. 154(b) by 791 days.

(21) Appl. No.: 11/903,955

(22) Filed: Sep. 25, 2007

(65) Prior Publication Data

US 2008/0074790 A1    Mar. 27, 2008

(30) Foreign Application Priority Data

Sep. 26, 2006    (JP) .............................. 2006-261043

(51) Int. Cl.
     *B41J 2/14*        (2006.01)
     *B41J 2/16*        (2006.01)

(52) U.S. Cl. .............................. 347/50; 347/58; 347/68

(58) Field of Classification Search .................. 347/50, 347/56–59, 68, 70–71

See application file for complete search history.

(56) References Cited

U.S. PATENT DOCUMENTS

| | | | |
|---|---|---|---|
| 6,390,602 | B1 | 5/2002 | Katakura et al. |
| 6,604,817 | B2 | 8/2003 | Isono et al. |
| 6,918,660 | B2 * | 7/2005 | Takahashi .................... 347/71 |
| 2005/0151796 | A1 | 7/2005 | Kubo |
| 2005/0206691 | A1 | 9/2005 | Takata et al. |
| 2005/0253488 | A1 | 11/2005 | Ito |

FOREIGN PATENT DOCUMENTS

| | | |
|---|---|---|
| JP | 58-168434 | 11/1983 |
| JP | 11235824 | 8/1999 |
| JP | 3171231 | 3/2001 |
| JP | 2001-246744 | 9/2001 |
| JP | 2005-193579 | 7/2005 |
| JP | 2005-271274 | 10/2005 |
| JP | 2005-322850 | 11/2005 |

\* cited by examiner

*Primary Examiner*—Juanita D Stephens
(74) *Attorney, Agent, or Firm*—Frommer Lawrence & Haug LLP

(57) ABSTRACT

A recording apparatus, including: a recording head having an actuator including first and second groups of terminals arranged in a direction; a flexible wiring member connected at one end thereof to the terminals and at the other end thereof to an external signal source and including first and second band-like regions which respectively correspond to the first and second groups of terminals and which extend generally in the direction, the first and second band-like regions respectively including first and second groups of wires disposed thereon and first and second connecting portions at the one end of the flexible wiring member which are respectively connected to the first and second groups of terminals, wherein at least a portion of one of the first and second band-like regions which extends from one of the first and second groups of terminals that is more distant from the other end of the flexible wiring member is disposed so as to overlap (a) the other of the first and second groups of terminals which is nearer to the other end of the flexible wiring member and (b) the other of the first and second band-like regions which extends from the other of the first and second groups of terminals.

12 Claims, 9 Drawing Sheets

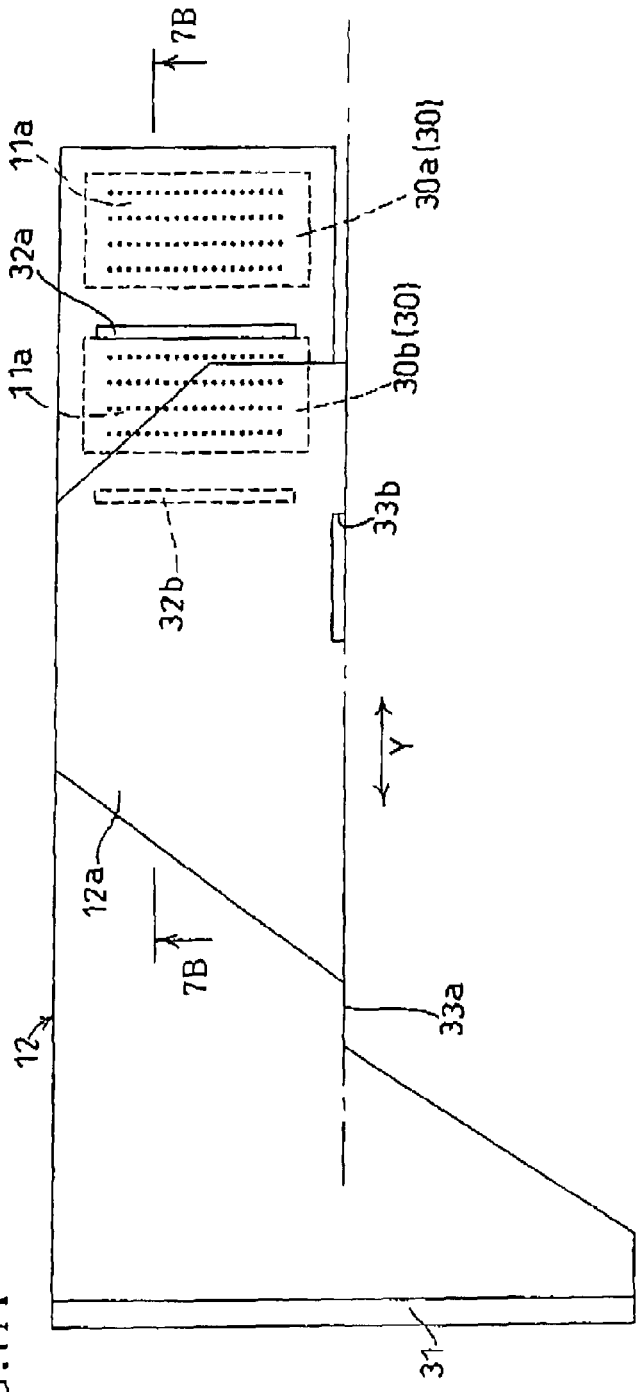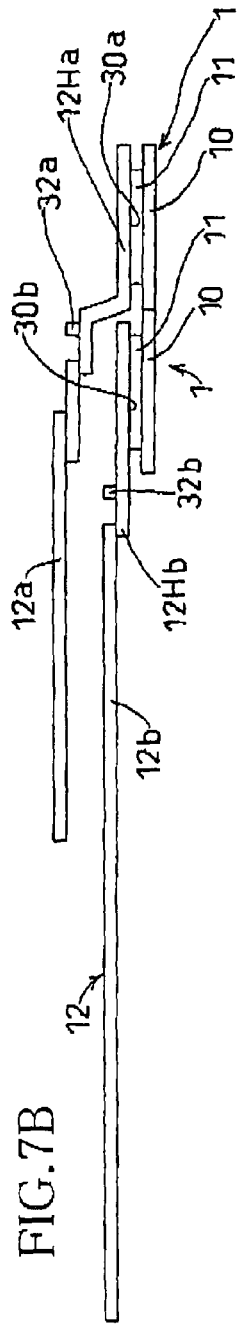
FIG.7A
FIG.7B

RECORDING APPARATUS HAVING FLEXIBLE WIRING MEMBER PORTIONS OF WHICH OVERLAP EACH OTHER

CROSS REFERENCE TO RELATED APPLICATION

The present application claims priority from Japanese Patent Application No. 2006-261043, which was filed on Sep. 26, 2006, the disclosure of which is herein incorporated by reference in its entirety.

BACKGROUND OF THE INVENTION

1. Field of the Invention

The present invention relates in general to a recording apparatus, and more particularly to a recording apparatus configured such that external signals are inputted to a recording head using a flexible wiring member.

2. Discussion of Related Art

As a recording apparatus including a recording head mounted on a carriage and configured to perform recording by ejection of ink from the recording head onto a recording medium while reciprocating the carriage in a main scanning direction, i.e., in a direction perpendicular to a direction of feeding the recording medium, there has been conventionally known a recording apparatus configured such that signals from a signal source are inputted to the recording head via a flexible wiring member for selectively ejecting the ink.

In an ink-jet printer that includes an ink-jet head as the recording head as disclosed in a Patent Document 1 (JP-A-2005-271274, in particular FIG. 2, corresponding to US Patent Application Publication No. 2005/0206691 A1), for instance, a head-side circuit board mounted on the carriage and the recording head are connected to each other via a flexible wiring member, and a drive circuit is mounted on the flexible wiring member, whereby signals from the head-side circuit board are inputted to the recording head via the drive circuit. The recording head includes a cavity portion in which nozzles and ink channels are formed, a piezoelectric actuator for giving an ejection pressure to the ink in the cavity portion, and a flexible wiring member electrically connected to the piezoelectric actuator. The cavity portion, the piezoelectric actuator, and the flexible wiring member are stacked on each other to provide the recording head.

In recent years, it has been required that the recording apparatus have an increased number of nozzles to be adaptable to a recording medium of a relatively large size and to satisfy a demand for a higher speed of recording. To this end, where the recording apparatus has the recording head as disclosed in the Patent Document 1, it is proposed to increase the size of one recording head, namely, to upsize the cavity portion, the piezoelectric actuator, and the flexible wiring member of the recording head. It is further proposed to juxtapose a plurality of recording heads each having a conventional size, as disclosed in a Patent Document 2 (JP-A-2005-193579, in particular, FIG. 3, corresponding to US Patent Application Publication No. 2005/0151796 A1).

SUMMARY OF THE INVENTION

Where the size of one recording head is increased, the number of conductor wires is inevitably increased due to increases in the number of the nozzles and the kind of the ink, resulting in an increase in the width of the flexible wiring member. In this instance, a larger space is required for installing the flexible wiring member.

Where the plurality of recording heads are juxtaposed to each other, the following problems arise. Since the flexible wiring member needs to be provided for each of the recording heads, a space for installing the flexible wiring member is required in each recording head. Further, a wiring work inevitably becomes cumbersome.

The present invention has been developed in the light of the situations described above. It is therefore an object of the invention to provide a recording apparatus which obviates an increase in the space required for installing the flexible wiring member as a result of upsizing the recoding head due to the increase in the number of nozzles and which ensures reduced labor for the wiring work for installing the flexible wiring member.

To achieve the object indicated above, the present invention provides a recording apparatus, comprising: a recording head including an actuator which has connecting terminals and operable to perform recording by an operation of the actuator; a flexible wiring member which is electrically connected at one end thereof to the connecting terminals of the actuator and at the other end thereof to an external signal source and which includes conductor wires through which drive signals are inputted to the actuator. The actuator includes a first group of connecting terminals as a part of the connecting terminals and a second group of connecting terminals as a part of the connecting terminals, the first group of connecting terminals and the second group of connecting terminals being arranged in a first direction. The flexible wiring member is branched so as to include a first band-like region and a second band-like region that correspond to the first group of connecting terminals and the second group of connecting terminals, respectively. The conductor wires of the flexible wiring member include a first group of conductor wires which constitute a part of the conductor wires and which are disposed on the first band-like region so as to be connected to the first group of connecting terminals and a second group of conductor wires which constitute a part of the conductor wires and which are disposed on the second band-like region so as to be connected to the second group of connecting terminals. The first band-like region and the second band-like region respectively include at said one end of the flexible wiring member a first connecting portion and a second connecting portion which are connected to the first group of connecting terminals and the second group of connecting terminals, respectively. The first band-like region and the second band-like region extends generally in the first direction respectively from the first group of connecting terminals and the second group of connecting terminals. At least a portion of one of the first band-like region and the second band-like region which extends from one of the first group of connecting terminals and the second group of connecting terminals which is more distant from the other end of the flexible wiring member is disposed so as to overlap (a) the other of the first group of connecting terminals and the second group of connecting terminals which is nearer to the other end of the flexible wiring member and (b) the other of the first band-like region and the second band-like region which extends from the other of the first group of connecting terminals and the second group of connecting terminals.

In the recording apparatus constructed as described above, even where the number of nozzles is increased, it is possible to reduce a space required for routing the flexible wiring member in the recording apparatus because portions of the flexible wiring member overlap each other and therefore the width of the flexible wiring member is reduced. Moreover, the arrangement ensures a simplified wiring work.

BRIEF DESCRIPTION OF THE DRAWINGS

The above and other objects, features, advantages and technical and industrial significance of the present invention will be better understood by reading a following detailed description of preferred embodiments of the invention, when considered in connection with the accompanying drawings, in which:

FIG. 7A is a plan view of the flexible wiring member of the second embodiment when the flexible wiring member is connected to the actuators and FIG. 7B is a cross-sectional view viewed along arrows 7B-7B in FIG. 7A;

DETAILED DESCRIPTION OF THE PREFERRED EMBODIMENTS

Figure 1:
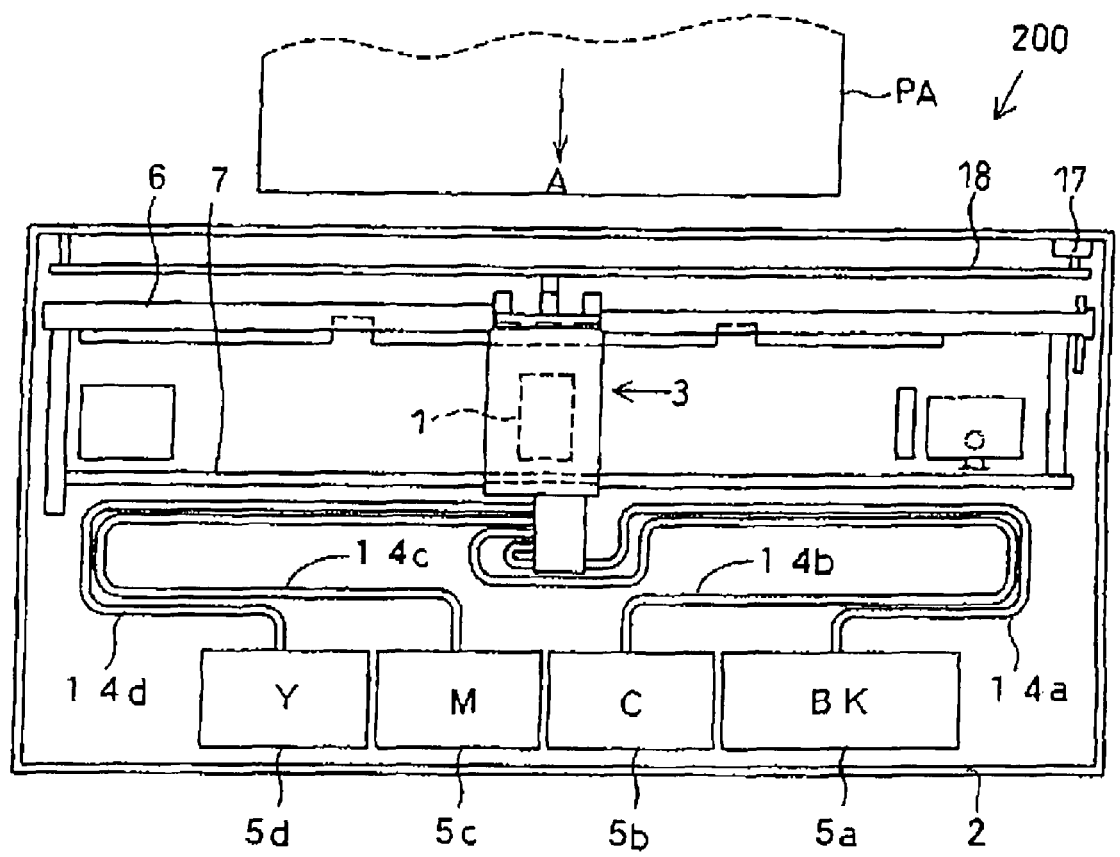
FIG. 1 is a plan view showing an ink-jet recording apparatus according to a first embodiment of the invention.

Referring to the drawings, there will be described preferred embodiments of the present invention. There will be first explained a first embodiment with reference to FIGS. 1-4.

FIG. 1 shows a recording apparatus of the present invention embodied as an ink-jet recording apparatus 200. The ink-jet recording apparatus 200 according to the first embodiment is utilized, for instance, not only as an independent printer device, but also as a printer function of a Multi Function Device (MFD) with a copier function, a scanner function, a facsimile function, etc. Inside a body frame 2 of the ink-jet recording apparatus 200, there is disposed a carriage 3 equipped with two recording heads 1, 1 which perform recording by ejection of ink onto a sheet PA as a recording medium.

In the body frame 2, the carriage 3 is slidably held on or supported by a rear guide shaft 6 and a front guide shaft 7 which are disposed in parallel with each other so as to extend in a main scanning direction of the carriage 3, i.e., in a Y direction shown in FIG. 1. The carriage 3 is configured to reciprocate in the main scanning direction, i.e., in the Y direction, by a carriage-driving motor 17 disposed at a right rear portion of the body frame 2 as seen in FIG. 1 and a timing belt 18 as an endless belt. Inks are supplied from respective ink supply sources (i.e., ink tanks) 5a-5d which are statically disposed in the body frame 2 toward the carriage 3 via respective ink supply tubes 14a-14d. In the exemplary embodiment, there are accommodated, in the respective ink tanks 5a-5d, inks of four different colors, e.g., a yellow ink (Y), a magenta ink (M), a cyan ink (C), and a black ink (Bk).

The sheet PA is horizontally fed by a known sheet-feeding mechanism (not shown) below a lower surface of each recording head 1 in a sub scanning direction (i.e., an X direction or a direction indicated by an arrow A shown in FIG. 1) perpendicular to the main scanning direction or the Y direction. The inks are ejected downward onto the sheet PA from a plurality of nozzles 100 which are open in the lower surface of the recording head 1 that is moved in the main scanning direction or the Y direction, whereby the recording is performed. A shown in FIG. 3, the nozzles 100 include black-ink nozzles 100a, magenta-ink nozzles 100b, cyan-ink nozzles 100b, and yellow-ink nozzles 100d. Where the nozzles 100a-100d need not be distinguished from each other, the nozzles 100a-100d are collectively referred to as the nozzles 100. In the following description, a side or a surface of each component of the ink-jet recording apparatus 200 which is nearer to a side or a surface of each recording head 1 in which the nozzles 100 are open (i.e., nozzle-opening surface or nozzle-opening side of each recording head 1) is referred to as a front or lower side or a front or lower surface of each component, while a side or a surface of each component which is remote from the nozzle-opening surface or side of each recording head 1 is referred to as a back or upper side or a back or upper surface of each component.

Figure 2:
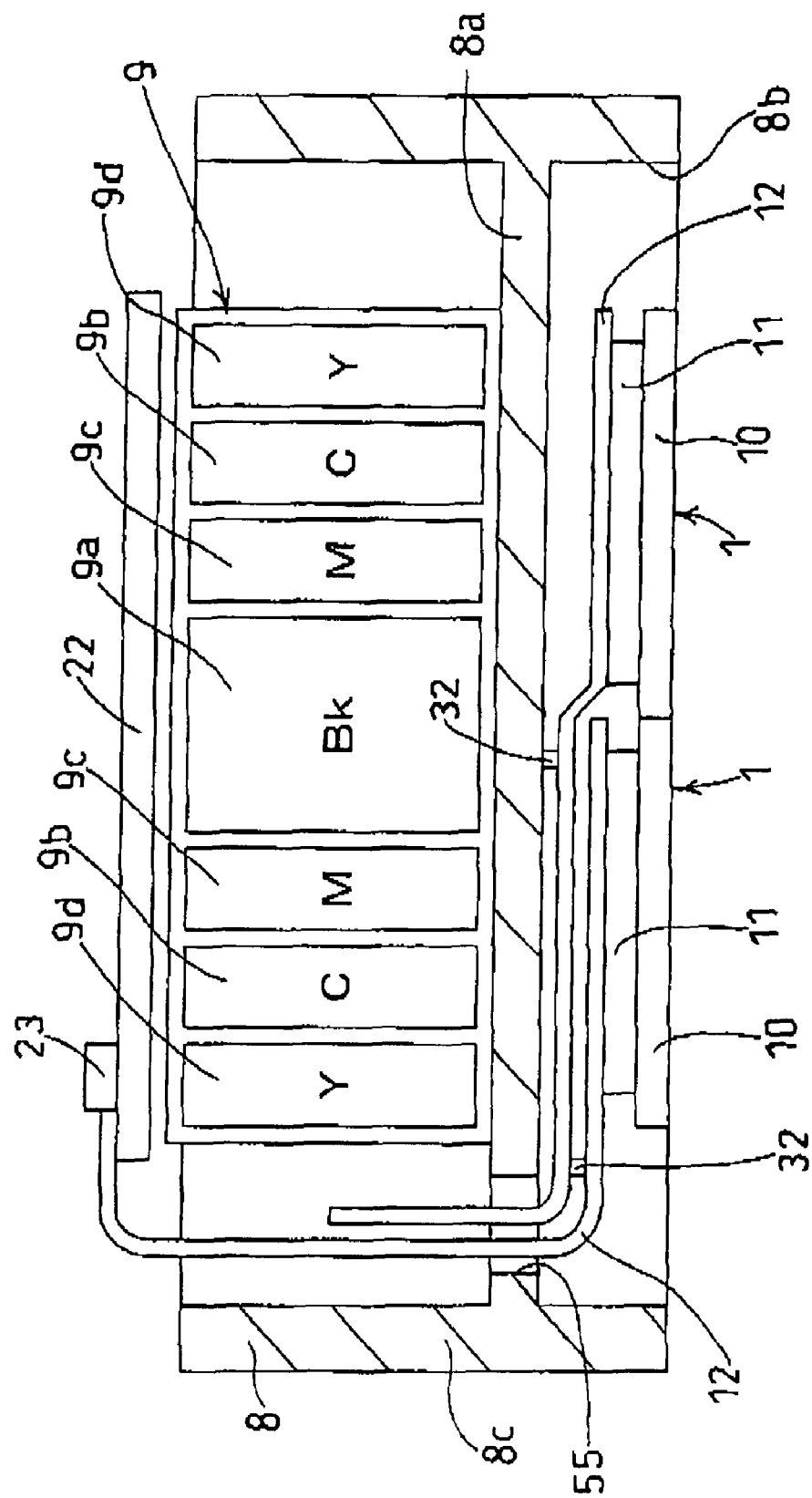
FIG. 2 is a cross-sectional view showing a carriage of a first embodiment taken along a line extending in a Y direction in FIG. 1.
Figure 3:
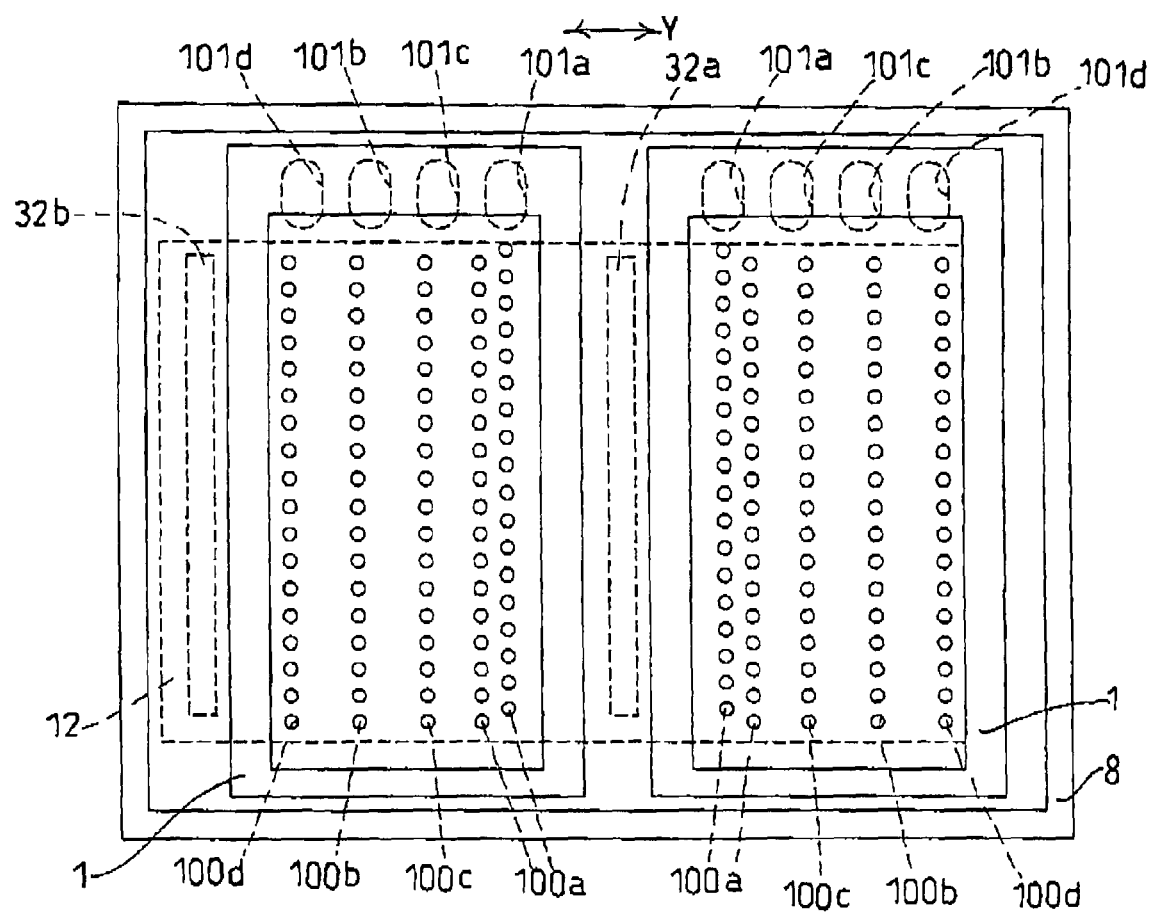
FIG. 3 is a bottom plan view of the carriage of the first embodiment.

As shown in FIG. 2, the carriage 3 includes a head holder 8 having a generally box-like shape which is open upward. On a back side of the head holder 8, there are disposed a head-side circuit board 22 and a damper device 9. On a lower side of a bottom plate 8a of the head holder 8, a recessed portion 8b is formed so as to be open downward. The two recording heads 1, 1 are fixedly accommodated using an adhesive agent in the recessed portion 8b such that the recording heads 1, 1 are arranged side by side in the X direction with the nozzles 100 exposed downward and such that each recording head 1 is kept in a posture substantially parallel to the bottom plate 8a.

Each recording head 1 has a rectangular shape in its plan view and has a laminar structure in which a cavity portion 10 and an actuator 11 are stacked on each other. The cavity portion 10 includes the plurality of nozzles 100 which are open in its lower surface and ink channels which are formed therein. The actuator 11 which is stacked on an upper surface of the cavity portion 10 applies an ejection pressure to the ink in the cavity portion 10. On the laminar structures of the respective recording heads 1, 1 each including the cavity portion 10 and the actuator 11, there is further stacked a flexible wiring member 12 which includes drive IC chips 32 equipped with respective drive circuits for driving the actuators 11, 11 of the respective recording heads 1, 1. The flexible wiring member 12 is branched toward one end thereof to be connected to the actuators 11, thereby providing two branch portions. The flexible wiring member 12 is connected to the actuators 11, 11 at connecting portions 30a, 30b (FIG. 4) formed at leading end portions of the respective branch portions and is connected at the other end thereof to a connector 23 disposed on the head-side circuit board 22 on which an electric circuit is formed. The flexible wiring member 12 will be explained in greater detail.

On the back side of the head holder 8, the head-side circuit board 22 is fixedly disposed by a support member (not shown) of the head holder 8. The head-side circuit board 22 includes the electric circuit which is electrically connected to an external signal source, namely, a body-side circuit board (not shown) disposed in the body frame 2, via another flexible wiring member (not shown). The head-side circuit board 22 is disposed at a position where the head-side circuit board 22 overlaps the recording heads 1, 1 in a plan view when viewed from the back side of the head holder 8. The head-side circuit board 22 and the recording heads 1, 1 are electrically connected to one flexible wiring member 12.

Like known cavity portions disclosed in JP-A-2001-246744, JP-A-2005-193579, etc., for instance, the cavity portion 10 is configured such that the inks individually supplied from a damper device 9 (which will be explained) to the cavity portion 10 via the corresponding ink inlets 101 (specifically, a black-ink inlet 101a, a magenta-ink inlet 101c, a cyan-ink inlet 101b, and a yellow-ink inlet 101d) formed in each recording head 1 are distributed, through the corresponding manifold chambers (not shown) in the cavity portion 10, into a plurality of pressure chambers (not shown). Operable portions of the actuator 11 each as an active portion that corresponds to each pressure chamber are actuated to selectively apply the ejection pressure to the pressure chambers, whereby the inks are ejected from the nozzles 100 (100a-100d) communicating with the corresponding pressure chambers.

The nozzles 100 are formed in a lowermost surface of each cavity portion 10 so as to be exposed downward, and are arranged in rows for the respective ink colors, which rows are parallel with each other and extend along a long side of the cavity portion 10 in the X direction. The black-ink nozzles 100a are arranged in two rows in each cavity portion 10 in consideration of the frequency of use of the black ink. The two recording heads 1, 1 are fixedly positioned adjacent to each other such that the nozzle rows of the respective recording heads 1, 1 are parallel with each other.

Each of the actuators 11, 11 in the present embodiment is a piezoelectric actuator similar to that disclosed in JP-A-2005-322850, for instance. More specifically explained, the actuator 11 includes a plurality of ceramic layers which are stacked on each other in a direction perpendicular to planes thereof and inner electrodes (not shown) each sandwiched by and between adjacent two of the ceramic layers. In each of the ceramic layers, the operable portions, i.e., the active portions, are formed such that each active portion is located in an area of the ceramic layer vertically interposed between adjacent two of the inner electrodes. Described in detail, the inner electrodes include inner individual electrodes corresponding to the respective pressure chambers and inner common electrodes each common to the plurality of pressure chambers. Accordingly, one active portion is formed in an area of each ceramic layer vertically interposed between one inner individual electrode and a corresponding portion of one inner common electrode. On an upper surface of each actuator 11, there are formed a group of connecting terminals 11a that include: external individual terminals (not shown) connected to the respective inner individual electrodes via respective electric through holes; and an external common terminal (not shown) connected to the inner common electrodes. The active portions are deformed by drive pulse signals applied to the corresponding external individual terminals, whereby the ejection pressure is selectively given to the corresponding pressure chambers.

On an upper side of the bottom plate 8a of the head holder 8, the damper device 9 which stores the inks that have been supplied toward the carriage 3 is disposed between the recording heads 1, 1 and the head-side circuit board 22. An inner space of the damper device 9 is divided into a plurality of ink chambers, specifically, a black-ink chamber 9a, magenta-ink chambers 9c, cyan-ink chambers 9b, and yellow-ink chambers 9d, as shown in FIG. 2. The inks of the different colors that have been supplied via the respective ink supply tubes 14a-14d are individually stored in the corresponding ink chambers 9a-9d. The black-ink chamber 9a has a size somewhat larger than the other ink chambers 9b-9d because of the high frequency of use of the black ink.

An opening (not shown) is formed through the bottom plate 8a of the head holder 8. Through the opening, the inks of the different colors are supplied independently of each other from respective ink outlets (not shown) of the damper device 9 to the respective ink inlets 101 (101a-101d) of each of the recording heads 1, 1. As shown in FIG. 2, at one of opposite end portions of the bottom plate 8 which is nearer to a side plate 8c of the head holder 8, there is formed a slit 55 through which the flexible wiring member 12 is inserted from a front side of the bottom plate 8a to the back side thereof. The flexible wiring member 12 passes through the slit 55 and upwardly extends along an inner surface of the side plate 8c toward the head-side circuit board 22.

The flexible wiring member 12 will be explained with reference to the developed view of FIG. 4. The flexible wiring member 12 is constituted by a single sheet material. In a state in which the flexible wiring member 12 is not yet connected to the actuators 11, 11, the flexible wiring member 12 includes a plurality of band-like regions, namely, two band-like regions 12a, 12b in the present embodiment, each of which has a width W and is elongated in a first direction, i.e., a Y direction indicated by arrows in FIG. 4. The two band-like regions 12a, 12b are arranged relative to each other in a widthwise direction of the flexible wiring member 12 perpendicular to the Y direction, and the band-like region 12a is joined to the band-like region 12b at a mid portion of one long-side edge of the band-like region 12b parallel to the Y direction.

Figure 4:
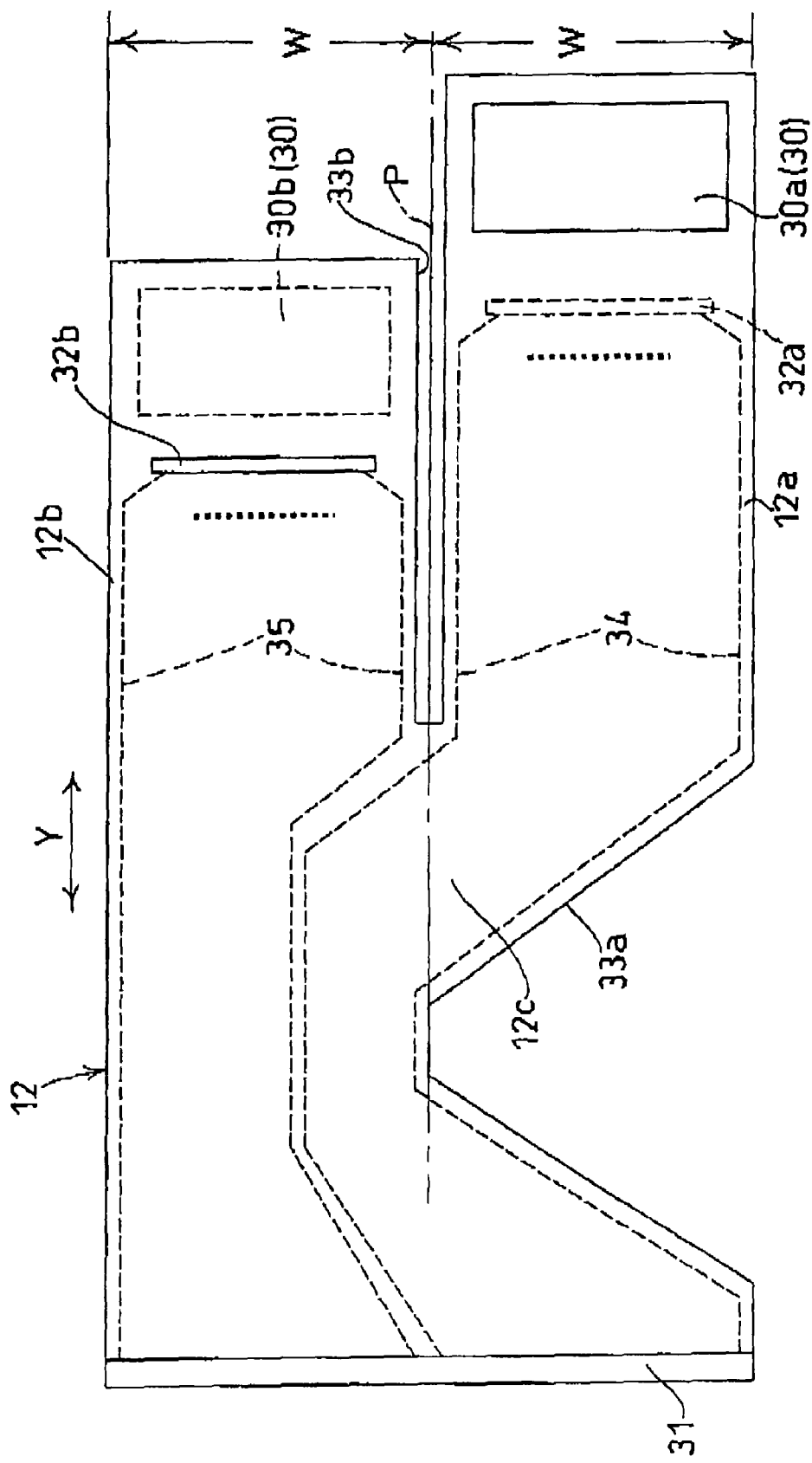
FIG. 4 is a plan view of a flexible wiring member of the first embodiment before the flexible wiring member is folded.

Described more specifically, on one of opposite sides of a joint portion 12c at which the two band-like regions 12a, 12b are joined to each other, which one side is nearer to the above-indicated one end of the flexible member 12 to be connected to the actuators 11, 11, namely, on a right-hand side in FIG. 4, the flexible wiring member 12 has a slit 33b which is formed between the band-like regions 12a, 12b and by which the band-like regions 12a, 12b are partitioned from each other. On the other of the opposite sides of the joint portion 12c which is nearer to the above-indicated other side of the flexible member 12, namely, on a left-hand side in FIG. 4, the flexible member 12 has a width-reduced portion which is provided by forming a cutout 33a shown in FIG. 4 and which has a width that substantially corresponds to a width of the band-like region 12b. The slit 33b and the cutout 33a described above permit the flexible wiring member 12 to be easily folded as described below, such that the width of the flexible wiring member 12 is reduced substantially to the width of the band-like region 12b. Accordingly, the arrangement ensures a reduced space for installation of the flexible wiring member 12.

Figure 5:
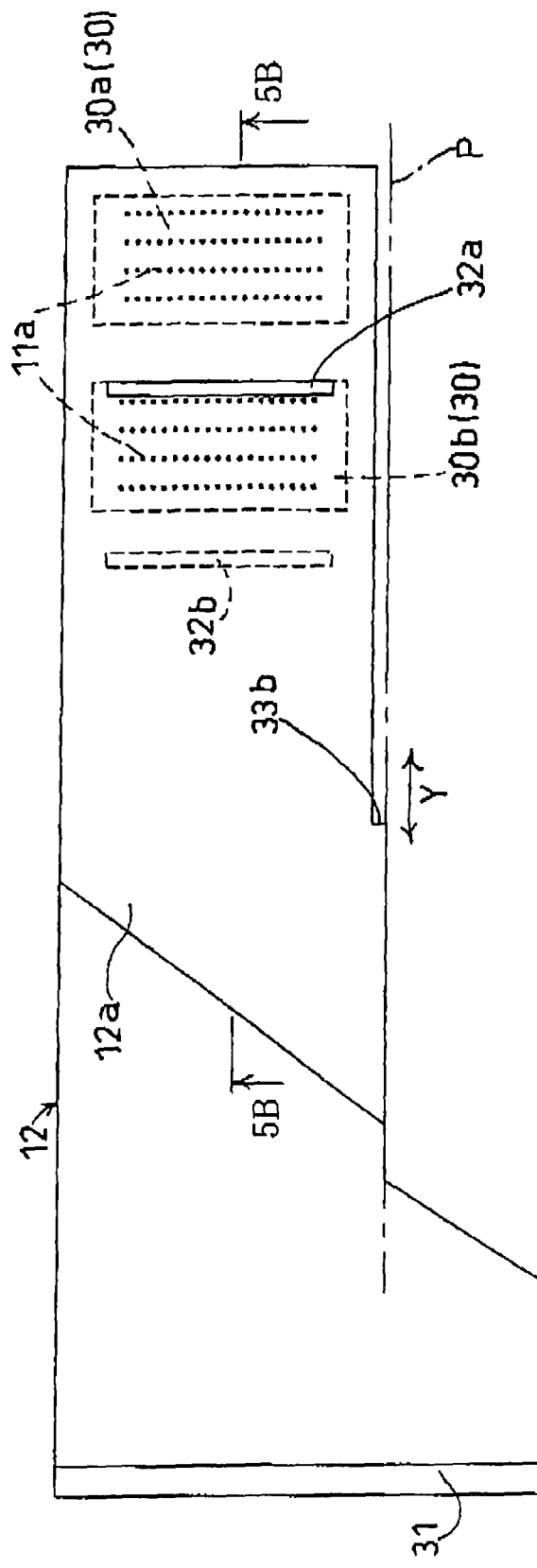
FIG. 5A is a plan view of the flexible wiring member of the first embodiment when the flexible wiring member is connected to actuators and FIG. 5B is a cross-sectional view viewed along arrows 5B-5B in FIG. 5A.

The two band-like regions 12a, 12b extending from the joint portion 12c have mutually different length dimensions depending upon positions of the respective actuators 11, 11 that are arranged in the Y direction. In other words, the position of the leading end portion of the band-like region 12a and the position of the leading end portion of the band-like region 12b are made different from each other so as to correspond to the respective different positions of the actuators 11, 11. At the leading end positions of the respective band-like regions 12a, 12b, the above-described connecting portions 30a, 30b are respectively formed so as to be connected to the respective groups of connecting terminals 11a, 11a of the respective actuators 11, 11. On each of the connecting portions 30a, 30b, there are formed a multiplicity of terminals (not shown) to be connected, in a one-to-one correspondence, to the external individual terminals and the external common terminal of the corresponding group of connecting terminals 11a shown in FIG. 5. According to the arrangement, the band-like regions 12a, 12b can be easily connected to the respective groups of connecting terminals 11a, 11a arranged in the first direction.

The flexible wiring member 12 is constituted by including: an electrically insulating base film; an electrically insulating cover film; and a multiplicity of conductor wires disposed between the base film and the cover film. Each of the terminals of the flexible wiring member 12 is formed by removing one of the base film and the cover film so as to allow a portion of the corresponding conductor wire to be exposed. The number of the conductor wires corresponds to a total number of the connecting terminals (11a, 11a) of the respective actuators 11, 11.

Because the flexible wiring member 12 is folded at the joint portion 12c such that the two band-like regions 12a, 12b are superposed on each other as described below, the terminals of the connecting portion 30b of the band-like region 12b are exposed on one of opposite surfaces of the flexible wiring member 12 that is to be opposed to the actuators 11, 11 while the terminals of the connecting portion 30a of the band-like region 12a are exposed on the other of the opposite surfaces of the flexible wiring member 12. According to the arrangement, the flexible wiring member 12 in which the two band-like regions 12a, 12b are disposed substantially in parallel with each other can be easily connected to the actuators 11, 11 simply by folding.

On the band-like regions 12a, 12b, the drive IC chips 32a, 32b are respectively mounted adjacent to the respective connecting portions 30a, 30b. The drive IC chips 32a, 32b convert recording data serially transmitted from the signal source into parallel data for the nozzles of each nozzle row and transmit the parallel data to the terminals of the respective connecting portions 30a, 30b. The arrangement can reduce a distance between each of the drive IC chips 32a, 32b and a corresponding one of the groups of connecting terminals 11a, 11a of the respective actuators 11, 11, thereby reducing a resistance of the conductor wires and obviating misoperations of the drive IC chips 32a, 32b.

The multiplicity of conductor wires of the flexible wiring member 12 include a first group of conductor wires disposed on the band-like regions 12a and a second group of conductor wires disposed on the band-like regions 12b. Between the IC chips 32a, 32b and the connecting portions 30a, 30b, the conductor wires are arranged relative to each other in a widthwise direction of the band-like regions 12a, 12b perpendicular to the Y direction. On one side of the IC chips 32a, 32b nearer to the signal source, the conductor wires are disposed such that conductor wires 34 are disposed on the band-like regions 12a and such that conductor wires 36 are disposed on the band-like region 12b, the conductor wires 34, 35 being arranged in the widthwise direction of the band-like regions 12a, 12b. The conductor wires 34 that constitute a part of the first group of conductor wires and the conductor wires 35 that constitute a part of the second group of conductor wires extend from the band-like region 12a and the band-like region 12b, respectively, toward the other end of the flexible wiring member 12. The number of the conductive wires 34, 35 is smaller than that of the conductive wires disposed between the drive IC chips 32a, 32b and the connecting portions 30a, 30b. Further, in the above-indicated width-reduced portion of the flexible wiring member 12 having the width that corresponds to the width of the band-like region 12b, both of the conductor wires 34, 35 are compiled in its widthwise direction. Outermost two of the conductor wires 34 respectively disposed on one and the other of widthwise opposite ends of the band-like region 12a and outermost two of the conductor wires 35 respectively disposed on one and the other of widthwise opposite ends of the band-like region 12b function as common voltage wires to be connected to the external common terminals of the respective groups of connecting terminals 11a, 11a and common voltage portions of the respective drive IC chips 32a, 32b.

At the other end of the flexible wiring member 12 nearer to the signal source, there are provided a group of terminals 31 which are connected to the connector 23 disposed on the head-side circuit board 22 and which are arranged in the widthwise direction of the flexible wiring member 12. Terminals 31 are connected to the conductor wires 34, 35 in a one-to-one correspondence. A widthwise dimension of the group of terminals 31 is not limited to 2×W, but may be adapted to a width of a commercially available connector (23). The arrangement ensures simplified structures of the group of terminals 31 and the connector 23 to be connected thereto, facilitating the wiring work.

When the thus constructed flexible wiring member 12 is connected to the actuators 11, 11, the flexible wiring member 12 is folded at the joint portion 12c at which the band-like regions 12a, 12b are joined to each other, along a centerline P between the two band-like regions 12a, 12, such that the band-like region 12a is superposed on the band-like region 12b and such that the width of the folded flexible wiring member 12 becomes equal to the width of the band-like region 12b. Because the band-like region 12a has a length as measured in the Y direction larger than that of the band-like region 12b, the connecting portions 30a, 30b of the respective band-like regions 12a, 12b are opposed to the respective groups of connecting terminals 11a, 11a of the respective actuators 11, 11. The terminals of each of the connecting portions 30a, 30b are bonded to the external individual terminals and the external common terminal of each of the groups of connecting terminals 11a, 11a by brazing (soldering) or by using an electrically conductive adhesive, as known in the art. Because the flexible wiring member 12 constituted by the single sheet material is simply folded, the manufacture of the flexible wiring member 12 is simplified and the installation space for the flexible wiring member 12 can be reduced.

In the present embodiment explained above, the band-like region 12a which extends from the group of connecting terminals 11a that is more distant from the other end of the flexible wiring member 12 at which the group of terminals 31 are formed overlaps both of the group of connecting terminals 11a that is nearer to the other end of the flexible wiring member 12 and the band-like region 12b, and extends toward the other end of the flexible wiring member 12. In this state, the flexible wiring member 12 is inserted into the slit 55 formed in the head holder 8. Accordingly, when the flexible wiring member 12 is routed in the head holder 8, the space in the head holder 8 occupied by the flexible wiring member 12 in the widthwise direction can be reduced, resulting in a decrease of the size of the head holder 8.

In the present embodiment, the flexible wiring member 12 is constituted by the single continuous sheet material in which are included a portion of the band-like region 12a including the connecting portion 30a, a portion of the band-like region 12b including the connecting portion 30b, and the rest of the flexible wiring member 12 except those portions. Accordingly, the flexible wiring member 12 can be easily provided.

Figure 6:
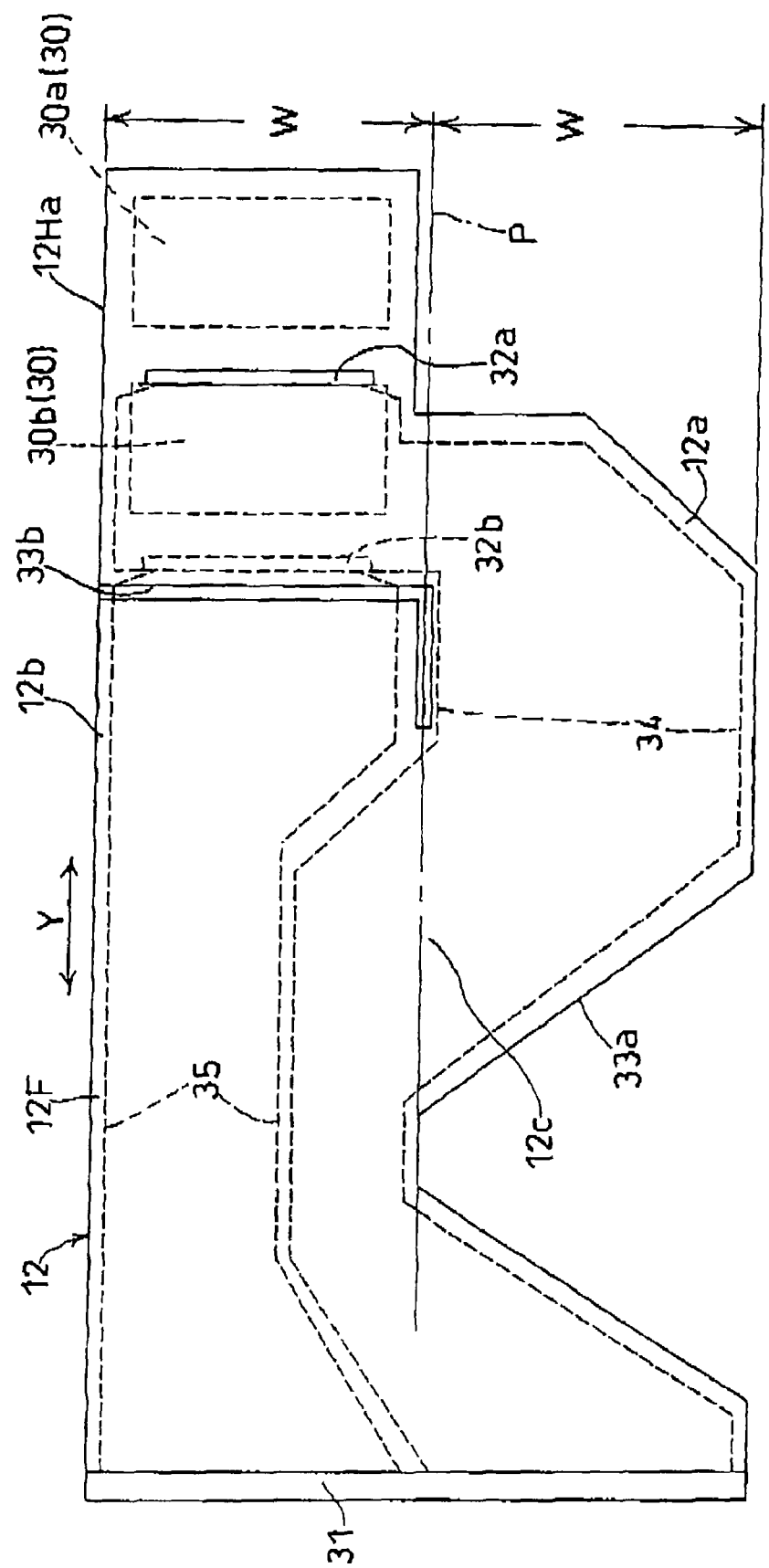
FIG. 6 is a plan view of a flexible wiring member of a second embodiment before the flexible wiring member is folded.
Figure 8:
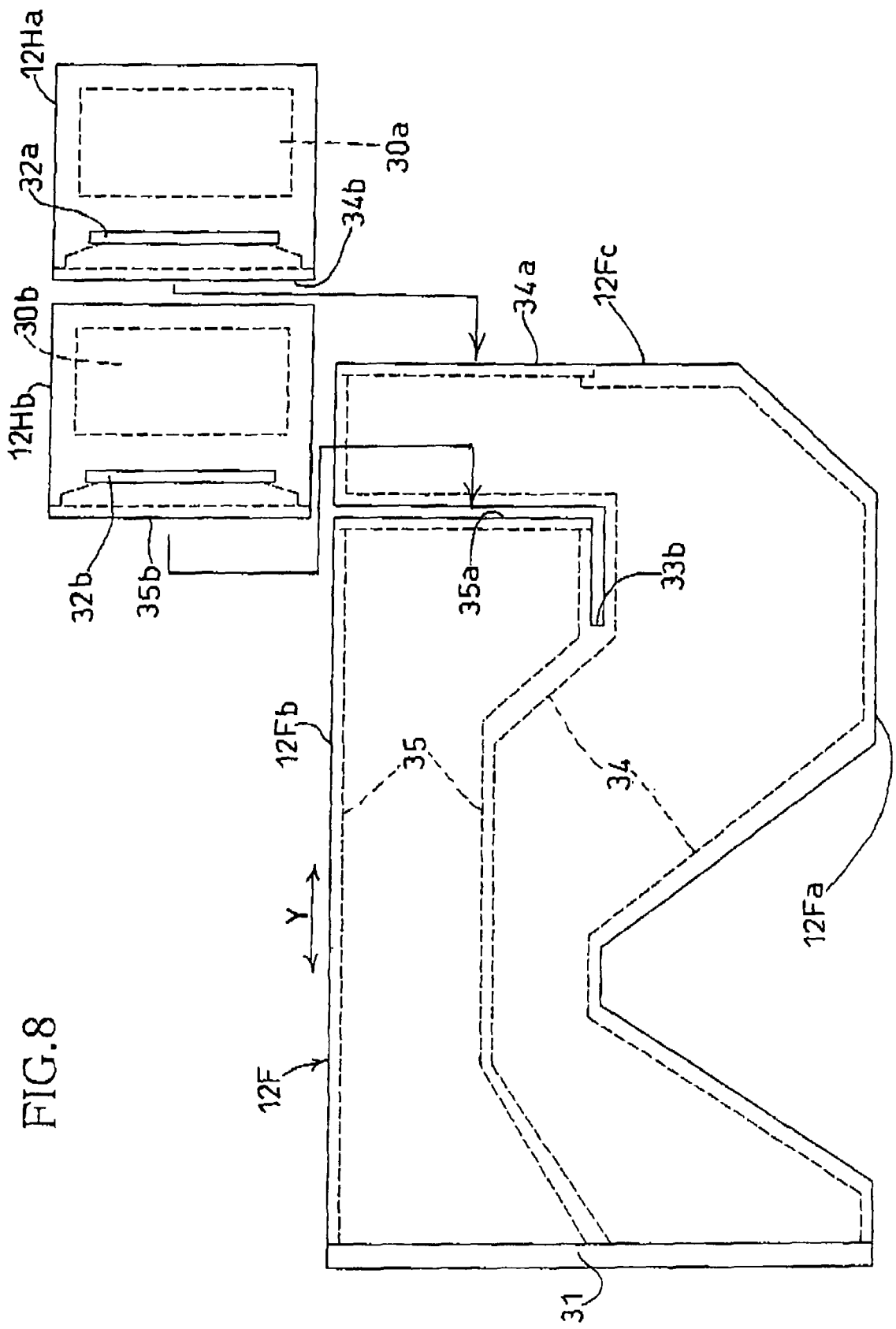
FIG. 8 is an exploded plan view of the flexible wiring member of the second embodiment.

Referring next to FIGS. 6-8, there will be explained a second embodiment of the invention. In the second embodiment, the same reference numerals as used in the illustrated first embodiment are used to identify the corresponding components and its detailed description is dispensed with. It is further noted that the advantages to be obtained by the same structure as in the first embodiment will not be repeatedly explained. Unlike the flexible wiring member 12 of the first embodiment in which the portion of the band-like region 12a including the connecting portion 30a is superposed on the band-like region 12b, the flexible wiring member 12 of the second embodiment includes the connecting portions 30a, 30b which are arranged side by side in the Y direction and the band-like region 12a except its connecting portion 30a is superposed on the band-like region 12b, namely, the flexible wiring member 12 is folded at the joint portion 12c, except the connecting portion 30a of the band-like region 12a.

As shown in FIG. 8, the flexible wiring member 12 of the second embodiment includes first wiring members 12Ha, 12Hb connected to the respective two recording heads 1, 1 and a second wiring member 12F for connecting the first wiring members 12Ha, 12Hb and the connector 23 to each other. The first wiring member 12Ha includes the connecting portion 30a connected to the group of connecting terminals 11a of a corresponding one of the two recording heads 1, 1 and the drive IC chip 32a while the first wiring member 12Hb includes the connecting portion 30b connected to the group of connecting terminals 11a of corresponding another of the two recording heads 1, 1 and the drive IC chip 32b. The first wiring members 12Ha, 12Hb correspond to the respective recording heads 1, 1 so as to be arranged in the first direction.

The groups of connecting terminals 11a, 11a, the connecting portions 30a, 30b, and the drive IC chips 32a, 32b are identical in construction with the respective corresponding components in the first embodiment. At one edge of each of the first wiring members 12Ha, 12Hb located on one of opposite sides of the drive IC chips 32a, 32b that is remote from the connecting portions 30a, 30b, the first wiring members 12Ha, 12Hb include a group of terminals 34b and a group of terminals 35b, respectively, which are respectively connected to the conductor wires 34 and the conductor wires 35 on the second wiring member 12F.

As in the first embodiment, the second wiring member 12F has two branch portions 12Fa, 12Fb which are separated from each other and which extend from the joint portion 12c toward the recording heads 1, 1. At a leading end of the branch portion 12Fb, a group of terminals 35a are exposed, and the first wiring member 12Hb is connected to the group of terminals 35a. The branch portion 12Fa extends parallel with the branch portion 12Fb, and is bent at its leading end toward the recoding heads 1, 1 so as to provide a bent portion 12Fc. At one side edge of the bent portion 12Fc remote from the group of terminals 35a of the branch portion 12Fb, a group of terminals 34a are exposed, and the first wiring member 12Ha is connected to the group of terminals 34a.

In the second wiring member 12F, the two branch portions 12Fa, 12Fb and the bent portion 12Fc are disposed so as not to overlap one another in a plan view, whereby the second wiring member 12F can be constituted by a single sheet material, thereby facilitating the manufacture of the flexible wiring member 12 and reducing the installation space for the same 12.

As in the first embodiment, on one side of the joint portion 12c nearer to the other end of the flexible wiring member 12, the second wiring member 12F has a cutout 33a and a group of terminals 31.

To the branch portions of the second wiring member 12F, the first wiring members 12Ha, 12Hb are respectively connected in the first or Y direction, whereby two band-like regions 12a, 12b are defined. The band-like region 12b connected to one of the two recording heads 1, 1 which is nearer to the terminals 31 has a straight shape like the band-like region 12b in the first embodiment. In contrast, the band-like region 12a is constructed to have a portion extending from the other of the two recording heads 1, 1 which is more distant from the terminals 31 over the one recording head 1 nearer to the terminals 31, the above-described bent portion 12Fc which is bent so as to extend in the widthwise direction of the flexible wiring member 12, and the above-described branch portion 12Fa which is arranged in the widthwise direction with respect to the band-like region 12b. According to the arrangement, the two-band like regions 12a, 12b can be connected to the respective groups of connecting terminals 11a, 11a on one surface of the flexible wiring member 12.

In the second embodiment, the band-like region 12a is folded along the centerline P such that the branch portion 12Fa and a part of the bent portion 12Fa which is located outwardly of the band-like region 12b in the widthwise direction are superposed on the band-like region 12b. In this state, the band-like region 12a extends from the other recording head 1 which is more distant from the terminals 31 over the one recording bead 1 which is nearer to the terminals 31 and overlaps the one recording head 1 and the band-like region 12b In the second embodiment, in a state in which the first wiring members 12Ha, 12Hb are connected to the respective recording heads 1, 1 and the second wiring member 12F is not yet connected, the drive IC chips 32a, 32b and the actuators 11, 11 can be tested for normality by passing an electric current therethrough. In a case where any abnormality is found in one drive IC chip 32a, 32b or one actuator 11 in one of the two recording heads 1, 1 that is connected to a corresponding one of the first wiring members 12Ha, 12Hb, only the abnormal drive IC chip 32a, 32b or actuator 11 can be discarded. Accordingly, the arrangement reduces an amount of components to be discarded, resulting in a reduction of the manufacturing cost. In the illustrated first embodiment and the following third embodiment, the flexible wiring member may be constituted by the first wiring members and the second wiring member as in the second embodiment.

Figure 9:
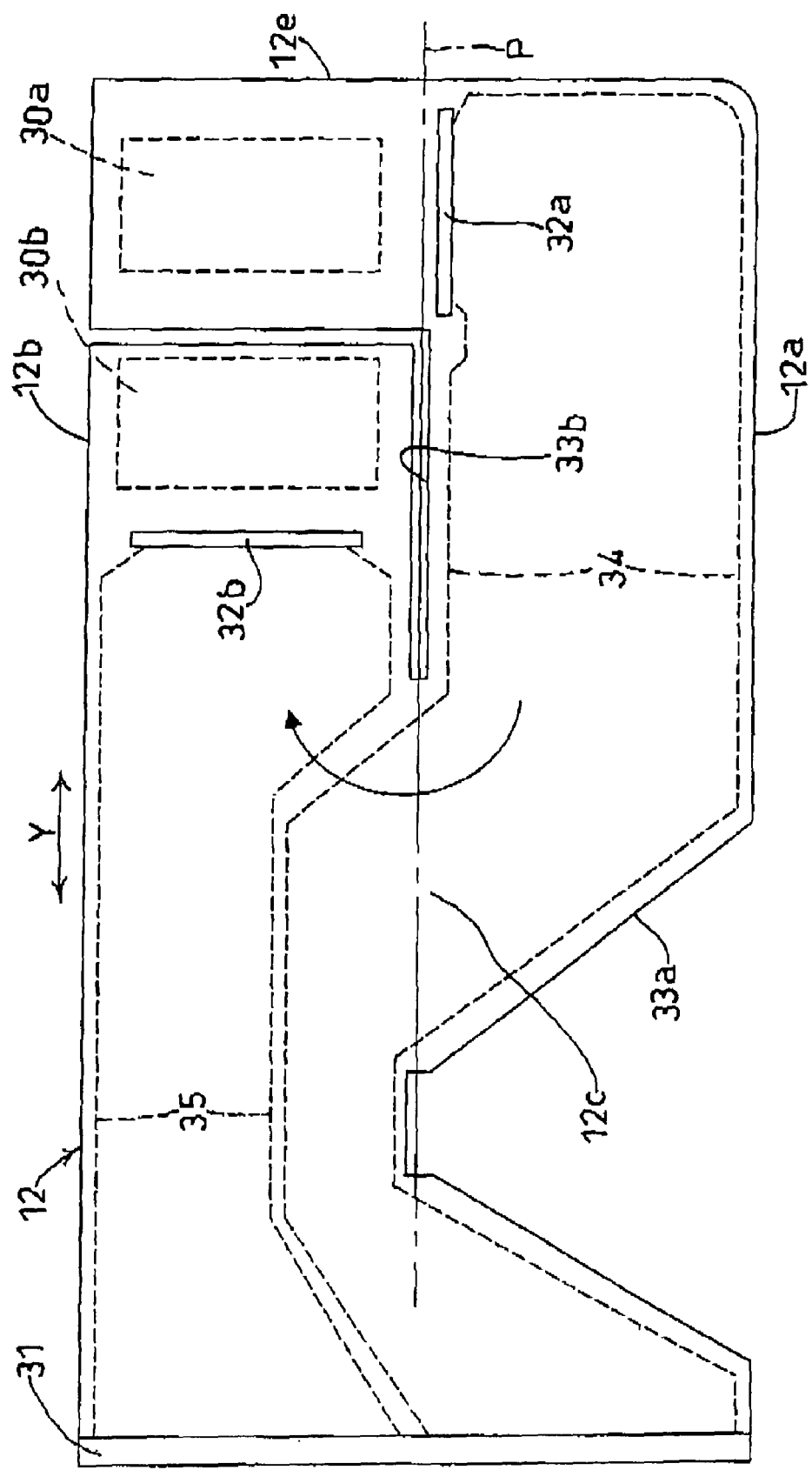
FIG. 9 is a plan view of a flexible wiring member of a third embodiment before the flexible wiring member is folded.

Referring next to the developed view of FIG. 9, the third embodiment of the invention will be explained. In the third embodiment, the same reference numerals as used in the illustrated first embodiment are used to identify the corresponding components and its detailed description is dispensed with. It is further noted that the advantages to be obtained by the same structure as in the first embodiment will not be repeatedly explained.

In the third embodiment, a band-like region 12b connected to one of the two recording heads 1,1 nearer to the terminals 31 is similar in construction to the band-like region 12b in the first embodiment. A band-like region 12a connected to the other of the two recording heads 1, 1 which is more distant from the terminals 31 has a bent portion 12e which is bent at and extends from the leading end of a branch portion in the widthwise direction of the flexible wiring member 12 so as to be located on one side of the band-like region 12b in its longitudinal direction corresponding to the Y direction. The bent portion 12e extends over the other recording head 1 which is more distant from the terminals 31 and includes the connecting portion 30a connected to the group of connecting terminals 11a of the recording head 1 in question. The drive IC chip 32a for that recording head 1 is disposed on one side of the group of connecting terminals 11a in the widthwise direction of the flexible wiring member 12.

In the third embodiment, the band-like region 12a is folded along a centerline P such that a portion thereof, except the bent portion 12e, located outwardly of the band-like region 12b in the widthwise direction overlaps the band-like region 12b. In this state, the band-like region 12a extends from the other recording head 1 which is more distant from the terminals 31 over the one recording head which is nearer to the terminals 31 and overlaps the one recording head 1 nearer to the terminals 31 and the band-like region 12b. In the flexible wiring member 12 according to the third embodiment, the band-like region 12a (including the bent portion 12e) and the band-like region 12b are disposed so as not to overlap each other in a plan view in a state in which the flexible wiring member 12 is not yet folded. Accordingly, the flexible wiring member 12 can be formed of a single sheet material, facilitating its manufacture. Moreover, the connecting portions 30a, 30b of the respective band-like regions 12a, 12b can be formed to be exposed on one surface of the flexible wiring member 12. This also facilitates the manufacture of the flexible wiring member 12.

In the illustrated first through third embodiments, the actuators 11, 11 having the respective groups of connecting terminals 11a, 11a are arranged in the first direction. Accordingly, where it is difficult to accurately produce an actuator which needs to be upsized due to an increase in the number of nozzles, a plurality of actuators (e.g., the two actuators 11, 11 in the illustrated embodiments) may be provided, eliminating a need of accurately producing an upsized actuator. In addition, it is possible to reduce a space required for routing the flexible wiring member in the apparatus.

While the slit 33b formed in each of the flexible wiring members 12 of the illustrated embodiments ensures easy folding of the flexible wiring members 12, the slit 33b may be eliminated. Where three or more recording heads 1 are arranged in the Y direction, the flexible wiring member 12 may be formed such that three or more band-like regions 12a, 12b, . . . are arranged in the widthwise direction of the flexible wiring member 12 perpendicular to the Y direction so as to correspond to the three or more recording heads 1. In this instance, the flexible wiring member 12 may be folded such that the three or more band-like regions are superposed on one another.

In the illustrated embodiments, the two recording heads 1, 1 are arranged side by side in the Y direction. The cavity portions of the two recording heads 1, 1 may be integrated into one cavity portion, and the pressure chambers and the nozzles required for that one cavity portion may be formed therein. In this instance, the pressure chambers and the nozzles may be respectively divided into a plurality of groups, and the actuator may be provided for each of the plurality of groups. For instance, two actuators are stacked on one cavity portion so as to be arranged side by side. Alternatively, there may be provided one actuator having a size corresponding to all of the pressure chambers. In this instance, the connecting terminals formed on the upper surface of the actuator may be divided into a plurality of groups (e.g., one actuator is stacked on one cavity portion and the connecting terminals of the actuator are divided into two groups) and the band-like regions of the flexible wiring member 12 may be connected to the respective groups of connecting terminals. Where the actuator is formed of the piezoelectric material as described above, the actuator may suffer from a deterioration in the dimensional accuracy relative to the pressure chambers due to shrinkage upon firing thereof. In this instance, it is preferable to provide the plurality of actuators.

While the groups of connecting terminals 11a, 11a of the respective actuators 11, 11 are arranged in the scanning direction of the carriage 3 in the illustrated embodiments, the groups of connecting terminals 11a, 11a may be arranged in a direction perpendicular to the carriage-scanning direction or in other directions. In such instances, the flexible wiring member 12 may extend from the recording head in the direction perpendicular to the carriage-scanning direction or in other direction.

In each of the illustrated embodiments, the flexible wiring member 12 is not folded at the other end thereof at which the terminals 31 are formed. The flexible wiring member 12 may be folded at the other end thereof. In this instance, a connector to be connected to the terminals 31 is configured to have a two-tier structure so as to correspond to a two-tier structure of the terminals obtained as a result of folding the flexible wiring member 12 at the other end thereof.

While the ink-jet recording apparatus to which the principle of the present invention is applied has been described in the embodiments illustrated above, the principle of the invention is equally applicable to various types of recording apparatus such as an impact type, provided that the recording apparatus is equipped with a plurality of recording elements and operable portions (active portions) respectively corresponding to the recording elements.

It is to be understood that the invention is not limited to the details of the illustrated embodiments, but may be embodied with various changes and modifications, which may occur to those skilled in the art, without departing from the spirit and scope of the invention defined in the attached claims.

What is claimed is:

1. A recording apparatus, comprising:
   a recording head including an actuator which has connecting terminals and operable to perform recording by an operation of the actuator;
   a flexible wiring member which is electrically connected at one end thereof to the connecting terminals of the actuator and at the other end thereof to an external signal source and which includes conductor wires through which drive signals are inputted to the actuator,
   wherein the actuator includes a first group of connecting terminals as a part of the connecting terminals and a second group of connecting terminals as a part of the connecting terminals, the first group of connecting terminals and the second group of connecting terminals being arranged in a first direction,
   wherein the flexible wiring member is branched so as to include a first band-like region and a second band-like region that correspond to the first group of connecting terminals and the second group of connecting terminals, respectively,
   wherein the conductor wires of the flexible wiring member include: (a) a first group of conductor wires which constitute a part of the conductor wires and which are disposed on the first band-like region so as to be connected to the first group of connecting terminals; and (b) a second group of conductor wires which constitute a part of the conductor wires and which are disposed on the second band-like region so as to be connected to the second group of connecting terminals,
   wherein the first band-like region and the second band-like region respectively include at said one end of the flexible wiring member a first connecting portion and a second connecting portion which are connected to the first group of connecting terminals and the second group of connecting terminals, respectively,
   wherein each of the first band-like region and the second band-like region extends generally in the first direction respectively from the first group of connecting terminals and the second group of connecting terminals, and
   wherein at least a portion of one of the first band-like region and the second band-like region which extends from one of the first group of connecting terminals and the second group of connecting terminals which is more distant from the other end of the flexible wiring member is disposed so as to overlap (a) the other of the first group of connecting terminals and the second group of connecting terminals which is nearer to the other end of the flexible wiring member and (b) the other of the first band-like region and the second band-like region which extends from the other of the first group of connecting terminals and the second group of connecting terminals.

2. The recording apparatus according to claim 1,
wherein the flexible wiring member includes, at the other end thereof, a group of terminals which are arranged in a widthwise direction of the flexible wiring member and which are connected to the conductor wires that constitute the first group of conductor wires of the first band-like region and the second group of conductor wires of the second band-like region, and
wherein the first band-like region and the second band-like region respectively have parallel portions which extend in parallel to each other, and
wherein the flexible wiring member includes, between (a) the parallel portions of the first band-like region and the second band-like region and (b) the group of terminals, a portion at which the first band-like region and the second band-like region are substantially continuous to each other in a widthwise direction of the flexible wiring member and on which are arranged portions of the conductor wires that constitute the first group of conductor wires and the second group of conductor wires, the portions extending from the first band-like region and the second band-like region.

3. The recording apparatus according to claim 1, wherein the flexible wiring member is formed by folding a sheet material in which at least a portion of the first band-like region and at least a portion of the second band-like region are arranged in a widthwise direction of the flexible wiring member, such that the at least a portion of the first band-like region and the at least a portion of the second band-like region are superposed on each other.

4. The recording apparatus according to claim 3, wherein, in a state in which the flexible wiring member is not yet folded, one of the first connecting portion and the second connecting portion which is to be connected to one of the first group of connecting terminals and the second group of connecting terminals which is nearer to the other end of the flexible wiring member is formed on one of opposite surfaces of the flexible wiring member while the other of the first connecting portion and the second connecting portion which is to be connected to the other of the first group of connecting terminals and the second group of connecting terminals which is more distant from the other end of the flexible wiring member is formed on the other of the opposite surfaces of the flexible wiring member.

5. The recording apparatus according to claim 3,
wherein, in a state in which the flexible wiring member is not yet folded, one of the first connecting portion and the second connecting portion which is to be connected to one of the first group of connecting terminals and the second group of connecting terminals which is more distant from the other end of the flexible wiring member is located so as to be arranged in the first direction with respect to the other of the first connecting portion and the second connecting portion which is to be connected to the other of the first group of connecting terminals and the second group of connecting terminals which is nearer to the other end of the flexible wiring member, and
wherein, in a state in which the flexible wiring member is not yet folded, one of the first band-like region and the second band-like region which is to be connected to said one of the first group of connecting terminals and the second group of connecting terminals which is more distant from the other end of the flexible wiring member has a shape which is bent, in the widthwise direction of the flexible wiring member, with respect to the other of the first band-like region and the second band-like region which is to be connected to the other of the first group of connecting terminals and the second group of connecting terminals which is nearer to the other end of the flexible wiring member.

6. The recording apparatus according to claim 1,
wherein the flexible wiring member includes a width-reduced portion which is provided by forming a cutout in the widthwise direction between (a) the first band-like region and the second band-like region and (b) the other end of the flexible wiring member and which has a width that substantially corresponds to a width of one of the first band-like region and the second band-like region, and
wherein at least a part of the conductor wires which constitute the first group of conductor wires and the second group of conductor wires is bent so as to be compiled in the width-reduced portion.

7. The recording apparatus according to claim 6, wherein the flexible wiring member has a slit formed between the first band-like region and the second band-like region so as to partition the first band-like region and the second band-like region from each other.

8. The recording apparatus according to claim 1, wherein a leading end position of the first band-like region at said one end of the flexible wiring member is made different from a leading end position of the second band-like region at said one end so as to correspond to respective different positions of the respective first and second groups of connecting terminals.

9. The recording apparatus according to claim 1, wherein each of the first band-like region and the second band-like region includes a drive circuit mounted thereon for driving the actuator.

10. The recording apparatus according to claim 9, wherein the flexible wiring member is formed by including: at least one wiring member that constitutes at least one of (a) a portion of the first band-like region including the first connecting portion and the drive circuit and (b) a portion of the second band-like region including the second connecting region and the drive circuit; and a wiring member that constitutes a rest of the flexible wiring member except the at least one of (a) the portion of the first band-like region including the first connecting portion and the drive circuit and (b) the portion of the second band-like region including the second connecting portion and the drive circuit, the at least one wiring member and the wiring member being joined to each other.

11. The recording apparatus according to claim 1, wherein the flexible wiring member is formed by including: a portion of the first band-like region including the first connecting portion; a portion of the second band-like region including the second connecting portion; and a rest of the flexible wiring member except the portion of the first band-like region including the first connecting portion and the portion of the second band-like region including the second connecting portion, the portion of the first band-like region including the first connecting portion, the portion of the second band-like region including the second connecting portion, the rest of the flexible wiring member being constituted by a single continuous sheet material.

12. The recording apparatus according to claim 1, wherein a plurality of actuators each as the actuator are arranged in the first direction, and the connecting terminals are divided into a plurality of groups so as to correspond to the plurality of actuators, respectively.

* * * * *